United States Patent [19]

Sasaki

[11] Patent Number: 4,725,975
[45] Date of Patent: Feb. 16, 1988

[54] LOGIC SIMULATOR OPERABLE ON LEVEL BASIS AND ON LOGIC BLOCK BASIS ON EACH LEVEL

[75] Inventor: Tohru Sasaki, Tokyo, Japan

[73] Assignee: NEC Corporation, Tokyo, Japan

[21] Appl. No.: 826,660

[22] Filed: Feb. 6, 1986

Related U.S. Application Data

[63] Continuation-in-part of Ser. No. 513,489, Jul. 13, 1983, abandoned.

[30] Foreign Application Priority Data

Jul. 13, 1982 [JP] Japan .................................. 57-121599
Jul. 13, 1982 [JP] Japan .................................. 57-121600
Oct. 8, 1982 [JP] Japan .................................. 57-177073

[51] Int. Cl.$^4$ ........................ G06F 15/00; G06F 11/00
[52] U.S. Cl. ................................. 364/900; 364/491
[58] Field of Search ... 364/200 MS File, 900 MS File, 364/300, 148, 150, 151, 551, 553, 578, 550, 491

[56] References Cited

U.S. PATENT DOCUMENTS

| 4,213,175 | 7/1980 | Kurihara | 364/151 X |
| 4,306,286 | 12/1981 | Cocke et al. | 364/200 |
| 4,358,822 | 11/1982 | Sánchez | 364/151 |

FOREIGN PATENT DOCUMENTS

0099114 1/1984 European Pat. Off. .
59-154374 9/1984 Japan .

OTHER PUBLICATIONS

"The Bipolar Digital Integrated Circuits Data Book for Design Engineers", Part I, Texas Instruments, 1982, pp. 1-8, 7-132, 7-133.

*Primary Examiner*—Archie E. Williams, Jr.
*Assistant Examiner*—Thomas C. Lee
*Attorney, Agent, or Firm*—Sughrue, Mion, Zinn, Macpeak & Seas

[57] ABSTRACT

A logic device, which may be a digital computer, is simulated by dividing the device into logic blocks and classifying the blocks by levels according to flow of signals in the device. A state memory simulates input and output logic states of the respective blocks. A simulator simulates operations of the respective blocks. The blocks on each level are successively simulated in four stages, namely, (1) provision of simulated logic states for the respective output logic states, (2) comparison of the simulated logic states with the respective output logic states, (3) decision of those of the input logic states of higher level blocks which should be changed into the simulated logic states, and (4) renewal of the output logic states and of the decided input logic states in the state memory. Renewal of the output logic states may be carried out during the stage (1). Alternatively, the logic blocks on each level are divided into groups with simulation for the blocks on each level substantially simultaneously carried out by a plurality of logic simulators which are assigned to the respective groups and are connected together for transfer of data and for renewal of the decided input logic states by the transferred data.

6 Claims, 5 Drawing Figures

LOGIC SIMULATOR OPERABLE ON LEVEL BASIS AND ON LOGIC BLOCK BASIS ON EACH LEVEL

This is a continuation-in-part, Ser. No. 513,489, filed July 13, 1983, now abandoned.

BACKGROUND OF THE INVENTION

This invention relates to a logic simulator for use in simulating operation of a logic device, which may be an electronic digital computer comprising a central processing unit, a main memory, a cache memory, and microprogram memories.

As will later be described with reference to one of several figures of the accompanying drawing, the logic device is used for carrying out an overall logic operation on a device input signal to provide a device output signal. Such a logic device is divisible into a plurality of logic blocks which have block input and output terminals and are themselves used for carrying out a first predetermined number of individual logic operations on input logic states of the block input terminals to provide output logic states of the block output terminals. The (block) input and output terminals are connected to one another in a predetermined manner of connection to receive the device input signal and to produce the device output signal. By way of example, a logic device may be divisible into more than ten thousand IC memories.

The device input signal may comprise a plurality of individual device input signals and the device output signal, a plurality of individual device output signals. Each logic block has at least one input terminal and at least one output terminal. It is to be noted as regards the predetermined manner of connection that an output terminal of a logic block is not ordinarily connected to any input terminal thereof but either to one or more input terminals of another logic block or to input terminals of other logic blocks and that each individual device input (output) signal is for at least one input (output) terminal of at least one logic block. Each individual logic operation need not be a single AND operation for two or more input logic states, a single inverting operation, or the like single operation but may be a combination of such single logic operations.

On simulating the overall logic operation by a logic simulator according to this invention, the logic blocks are identified by block numbers, respectively. The block input and output terminals are identified by block input and output terminal numbers, respectively. One and the same block input terminal number may be used in common for input terminals of different logic blocks. Even in this event, it is possible to understand that such input terminals are identified by different block input terminal numbers, respectively, because the logic blocks are identified by different block numbers, respectively.

The individual logic operations are identified by respective types. It is convenient to assign the types to the respective logic blocks rather than to the respective individual logic operations. Similarly, it is desirable to allot the input logic states to the respective block input terminals and consequently to the respective block input terminal numbers and the output logic state to the respective block output terminal numbers.

The predetermined manner of connection between a block output (input) terminal and at least one block input (output) terminal is defined by a combination of a block output (input) terminal number and at least one block input (output) terminal number. It is therefore possible to define the predetermined manner of connection by such combinations.

The input logic state of an input terminal of a logic block is dependent on at least one previously carried out individual logic operation. In other words, the input logic state is decided by the number of logic blocks through which an individual device input signal reaches the block input terminal. The logic blocks are given a second predetermined number of level numbers in consideration of the predetermined manner of connection. For example, the level number of a logic block is given by a maximum number of the logic blocks through which an individual device input signal arrives at a certain input terminal of the logic block under consideration.

On designing a logic device, an error or defect, if any, in the logic or circuitry design should be discovered or detected as early as possible during progress of the design. Otherwise, the design is subject to a serious delay and also to an intolerable expense. This is because correction or change of circuitry is very troublesome and difficult after a logic device is actually manufactured. This is also the case with debugging of a program. Such a diagnosis operation for the design error or errors must rapidly be carried out even for a complicated overall logic operation of a logic device.

A logic simulator is very effective in error diagnosis of an overall or a partial logic operation of a logic device. With a logic simulator, it is possible to find the design error without actually manufacturing the logic device in compliance with a possibly erroneous design.

A conventional logic simulator is mostly based on software. The individual logic operations have actually been conventionally carried out in sequence. The sequential process has resulted in a long simulation time when the simulation must be carried through for an overall logic operation of a large logic scale.

SUMMARY OF THE INVENTION

It is therefore a general object of the present invention to provide a logic simulator, which rapidly operates unless a design error is found and must at once be dealt with.

It is a specific object of this invention to provide a logic simulator, which is operable about ten thousand times as fast as a conventional software logic simulator.

It is another specific object of this invention to provide a logic simulator, which is operable at a rate of up to six million IC simulations (over one billion gate simulations) per second.

A logic simulator according to this invention is for simulating an overall logic operation carried out by a logic device on a device input signal to provide a device output signal. The logic device should be divisible into a plurality of logic blocks which are identified by block numbers, respectively. The logic blocks carry out individual logic operations identified by types, respectively, and have block input and output terminals identified by block input and output terminal numbers, respectively, and are directly connected to one another in a predetermined manner of connection so that the device input signal may flow through the logic blocks to provide input and output logic states at the block input and output terminals. Thereby, the individual logic operations are carried out on the input logic states to provide the output logic states and eventually the device output signal. The logic blocks are given level numbers according to the flow of the device input signal from a lower number to a higher number. The logic simulator according to this invention comprises first signal producing means, first memory means, simulating means, second signal producing means, second memory means, substituting means, and updating means as follows.

The first signal producing means produces a first address signal which is successively indicative of the block numbers of the respective logic blocks of each level number and then the block number for a next higher level number.

The first memory means memorizes, for the respective block numbers, the types and, for each block number, the input and output logic states of the respective block input and output terminals of the logic block of the block number under consideration. The first memory means is responsive to the first address signal indicative of each block number to produce a first output signal representative of the type for the block number being indicated and the input and output logic states for the indicated block number.

The simulating means is responsive to the first output signal produced in response to the first address signal indicative of each block number for simulating the individual logic operation of the type represented by the first output signal to provide a simulated logic operation for the indicated block number. The simulating means thereby carries out the simulated logic operation on the input logic states represented by the output signal to provide simulated logic states for the indicated block number and to also produce a simulated signal representative of the simulated logic states.

The second signal producing means is responsive to the first address and output signals and the simulated signal for producing a second address signal comprising a first and a second part. The first part is indicative of each block number indicated by the first address signal. The second part is indicative of state-varied output terminal numbers identifying those state-varied ones of the block output terminals of the logic block of the block number indicated by the first part. At the so indicated block, the output logic states represented by the first output signal are varied to the simulated logic states represented by the simulated signal.

The second memory means memorizes, for each block number, the block numbers of those connected ones of the logic blocks which have block input terminals directly connected in the predetermined manner of connection to the block output terminals of the logic block of the block number under consideration. The second memory means also memorizes for the respective block output terminal numbers of the last-mentioned block output terminals, the block input terminal numbers of the last-mentioned block input terminals. The second memory means is responsive to the second address signal to produce a second output signal representative of the block number of each connected logic block for the block number indicated by the first part and those state-varied ones of the block input terminal numbers which are memorized for the respective state-varied output terminal numbers indicated by the second part.

The substituting means is coupled to the first memory means and is responsive to the simulated signal for substituting the simulated logic states represented by the simulated signal produced for the block number indicated by the first address signal for the output logic states memorized in the first memory means for the block number indicated by the first address signal.

The updating means is coupled to the first memory means and is responsive to the second output signal for updating, with reference to the state-varied input terminal numbers represented by the second output signal, the input logic states memorized in the first memory means for the block number represented by the second output signal.

As will later become clear as the description proceeds with reference to the accompanying drawing, other logic simulators are operable as equivalents to the above-specified logic simulator according to this invention. Each equivalent logic simulator comprises similar means, which are operable in response to a different combinations of input signals to produce an output signal representative of similar but somewhat different items.

According to an aspect of this invention, there is provided a logic simulator of the above-specified type wherein the substituting means comprises additional memory means and means coupled to the updating means.

The additional memory means memorizes, for each block number, the block number under consideration and the block output terminal numbers for the block number under consideration. The additional memory means is responsive to the second address signal to produce an additional output signal representative of the block number indicated by the first part and the state-varied output terminal numbers indicated by the second part.

The means coupled to the updating means is responsive to the additional output signal for causing the updating means to update, with reference to the state-varied output terminal numbers represented by the additional output signal, the output logic states memorized in the first memory means for the block number represented by the additional output signal.

According to another aspect of this invention, there is provided a logic simulator of the above-specified type wherein the first signal producing means makes the first address signal retain an indication of each block number until the substituting means substitutes the simulated logic states for the output logic states memorized in the first memory means for the block number being indicated.

According to still another aspect of this invention, there is provided a logic simulator of the above-specified type for which the logic blocks of each level number are allotted to a third predetermined number of groups.

In the logic simulator of the last-mentioned aspect of this invention, each of the first signal producing means, the first memory means, the simulating means, the second signal producing means, the second memory means, and the substituting means is assigned to the respective groups so that that one of the first signal producing means, that one of the first memory means, that one of the simulating means, that one of the second signal producing means, that one of the second memory means, and that one of the substituting means, all of which are assigned to each group, with the block number of the logic block of the group under consideration.

In the logic simulator of the last-mentioned aspect of this invention, the updating means comprises first and second means as follows.

The first means is coupled to the first memory means assigned to the respective groups and is responsive to the second output signal produced by the second memory means assigned to each group for updating the input logic states in the first memory means assigned to the group comprising the logic block of the block number represented by the last-mentioned second output signal.

The second means is coupled to the first means and to the first signal producing means assigned to the respective groups and causes the first address signal to successively indicate the level numbers from each thereof to another thereof when the input logic states are updated by the first means in the first memory means assigned to the respective groups.

DESCRIPTION OF THE PREFERRED EMBODIMENTS

Figure 1:
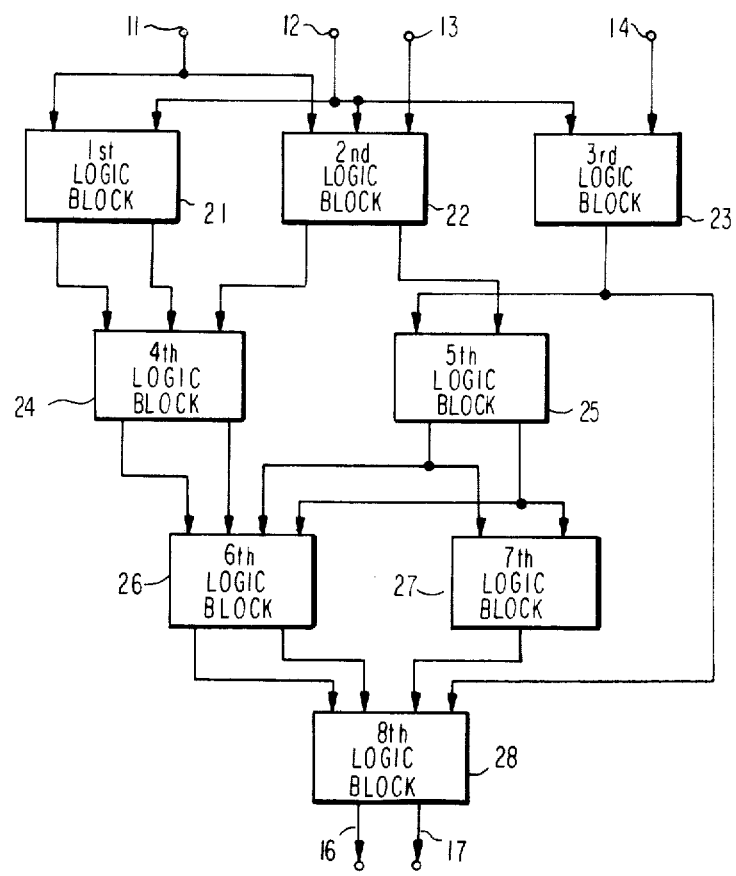
FIG. 1 exemplifies in blocks a logic device, of which operation is for diagnosis by a logic simulator according to the instant invention.

Referring to FIG. 1, a logic device will be exemplified at first in order to facilitate an understanding of the present invention. For clarity of the description which follows, it will be assumed that a logic simulator according to this invention carries out diagnosis of an overall logic operation of the logic device by simulating its operation. Operation of the logic simulator will be called a diagnosis operation. The operation simulated by the logic simulator will be named patient behavior regardless of presence and absence of a defect in the behavior. The logic simulator therefore carries out a diagnosis operation of the patient behavior.

The logic device comprises first through fourth device input terminals 11, 12, 13, and 14 and first and second device output terminals 16 and 17. The logic device is divided into first through eighth logic blocks 21, 22, 23, 24, 25, 26, 27, and 28. Each logic block has at least one block input terminal and at least one block output terminal.

It will by assumed merely for convenience of description that each logic block is an IC. Each block input terminal is therefore an input pin and each block output terminal is an output pin. It will moreover be assumed that the input and the output pins are directly connected to one another and to the (device) input and output terminals 11 through 14, 16, and 17 in conformity with a predetermined manner of connection, which is depicted in the figure being referred to.

The IC's 21 through 28 carry out various individual logic operations on device input signals supplied to the respective input terminals 11 through 14 to provide device output signals at the respective output terminals 16 and 17. In the meanwhile, logic-processed signals flow through the IC's 21 to 28 generally from the input terminals 11 through 14 towards the output terminals 16 and 17 as block or pin input and output signals. Each of the device and pin input and output signals assumes a logic state either of logic one and zero at any one time.

It is convenient in describing the diagnosis operation on the patient behavior to assign level numbers to the IC's 21 through 28 in accordance with the general flow of signals. More specifically, three IC's 21 through 23 having input pins directly connected to the input terminals 11 through 14 and depicted at the top of the IC's 21 through 28, are given a level number one. Alternatively, the three IC's 21 through 23 are referred to as IC's of a first level or first level IC's. Two IC's 24 and 25 which receive pin output signals from the first level IC's 21 through 23, are assigned with a level number two. In this manner, two other IC's 26 and 27 are given a level number three. Only one IC 28 is exemplified as a fourth level IC.

During progress of the patient behavior, input terminal logic states of the input terminals 11 through 14 vary from time to time between the logic one and zero states. Pin output logic states at the respective output pins of an IC of a certain level number are dependent on the input terminal logic states and the individual logic operation carried out thereby on the input pin logic states. In other words, the logic state of an output pin depends on the number of IC's through which a device input signal appears at the output pin under consideration, namely, the number of individual logic operations carried on the device input signal. The above-exemplified level number is equal to the maximum of the numbers of such IC's or individual logic operations. Incidentally, the input and output terminal logic states and input and output pin logic states which the logic device has at the start of the patient behavior will be referred to with addition of a modifier "initial."

The IC's 21 through 28 are identified by block numbers, respectively. For example, the IC's of the first level are preferably identified by block numbers starting at one. Merely for brevity of description, block numbers one through three will be given to the first through the third IC's 21 to 23. The IC's of every level number are conveniently identified by consecutively ascending block numbers. In this event, the fourth through the eighth IC's 24 to 28 are identified by block numbers four through eight. The order in which the block numbers are given to the IC's of each level number, is immaterial. The block numbers one through eight will be represented by decimal numerals 100 through 800, respectively.

It is to be noted in connection with the above that the input terminals 11 through 14 provide the input logic states of at least the IC's 21 through 23 of the first level. It is therefore possible to understand that the input terminals 11 through 14 are four input pins of an "IC" of a block number zero and of a level number zero or a zeroth level. The zero level "IC" carries out a specific individual logic operation of giving the output logic states according to the input logic states as they are, that is, an identity operation. The input terminals 11 through 14 therefore serves also as the output pins of the "IC" of the block number zero and of the level number zero.

The first IC 21 given the block number 100, has two input pins and two output pins. According to the predetermined manner of connection, the two input pins are directly connected to the first and the second input terminals 11 and 12. The two output pins are directly connected to two of three input pins of the fourth IC 24. Such input pins of each IC may be given first, second, and similar input pin (namely, block input terminal) numbers, which are conveniently represented by 01, 02, and so forth. The output pins of each IC are given first, second, and like output pin numbers, which may be designated by 11, 12, and so on. In this manner, it is possible to identity all pins of the IC's 21 through 28 by three-digit decimal numbers unless at least one of the IC's has one hundred or more pins. By way of example, the input or the output pins will be numbered from left to right in the figure.

Each IC usually has more than thirty input and more than thirty output pins. It is therefore more convenient to use "5" as the ten's digit of the output pin numbers rather than the ten's digit of "1" as described above. Under the circumstances, the fifth IC 25 has first and second input pins 501 and 502 directly connected to a single output pin 351 of the third IC 23 and to a second output pin 252 of the second IC 22, respectively. First and second output pins 551 and 552 are directly connected to third and fourth input pins 603 and 604 of the sixth IC 26 and also to first and second input pins 701 and 702 of the seventh IC 27. The input terminals 11 through 14 may likewise be given input "pin" numbers 001 through 004, respectively. The output terminals 16 and 17 are the output pins of at least one IC and need not be given specific output "pin" numbers.

The individual logic operations may or may not differ from one IC to another. It will be assumed for clarity of description that the IC's 21 and 25 are for carrying out individual logic operations of a first type. The IC's 22 and 24 are for carrying out individual logic operations of a second type, the IC's 23 and 27, individual logic operations of a third type, and the IC's 26 and 28, individual logic operations of a fourth type. It should be understood that the differently numbered types show different individual logic operations. As pointed out heretobefore, each individual logic operation may be a combination of logic operations to be carried out on the input logic states of the IC in question. At any rate, the individual logic operations of the respective IC's will be identified by differently numbered types.

The number of different individual logic operations is referred to hereinabove as the first predetermined number. For the logic device being exemplified, the first predetermined number is equal to four. The number of levels is called the second predetermined number. Attention may be directed only to the actual IC's 21 through 28. In this event, the second predetermined number is equal to four. If the zeroth level is also taken into account, the second predetermined number becomes equal to five.

Figure 2:
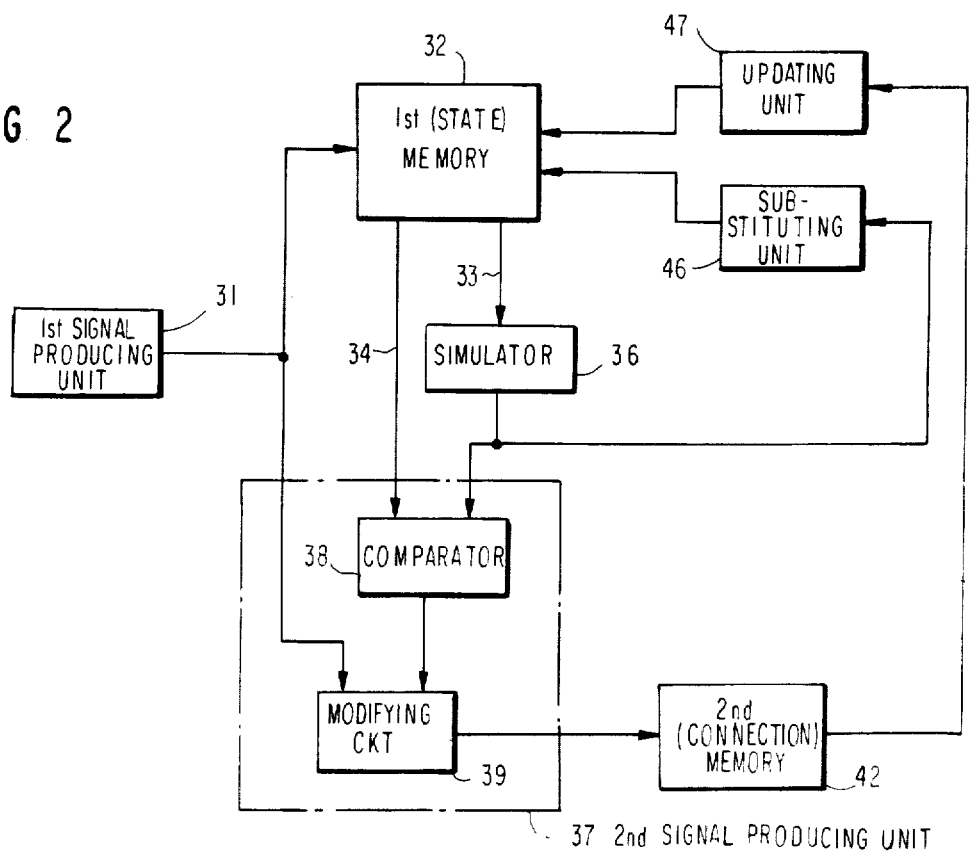
FIG. 2 is a block diagram of a logic simulator according to an embodiment of this invention.

Turning to FIG. 2, a logic simulator according to an embodiment of this invention is for use in simulating an overall logic operation of a logic device of the type exemplified with reference to FIG. 1. Various circuit units, which will be described in the following, will later be described in detail as the description proceeds with reference to other figures of the accompanying drawing.

The logic simulator comprises a first signal producing unit 31 for generating a first address signal successively indicative of the zeroth through the fourth level numbers and, while indicating each level number, the block number of each IC given the level number being indicated. It will be assumed without loss of generality that the block numbers zero through eight are successively indicated while the zeroth through the fourth levels are indicated.

A first memory unit 32 is for memorizing, for the respective block numbers zero through eight, the types and, for each block number, the input and output logic states of the respective input and output pins of the IC of the block number under consideration. The first memory unit 32 is responsive to the first address signal indicative of each block number to produce a first output signal representative of the type of the IC of the block number being indicated and the input and output logic states of the input and output pins of the IC of the individual block number.

The first output signal is depicted as first and second portions 33 and 34. The first portion 33 represents the type and the input logic states. The second portion 34 represents the output logic states.

A simulating unit 36 is responsive to the first portion 33 produced in response to the first address signal indicative of each block number for simulating the individual logic operation of the type represented by the first portion 33. The simulating unit 36 thereby provides a simulated logic operation for the IC of the indicated block number and carries out the simulated logic operation on the input logic states represented by the first portion 33 to provide simulated logic states for the output pins of the IC of the indicated block number and to produce a simulated signal representative of the simulated logic states.

A second signal producing unit 37 is supplied with the first address signal, the second portion 34, and the simulated signal. The second signal producing unit 37 produces a second address signal comprising a first and a second part. The first part is indicative of each block number indicated by the first address signal. The second part is indicative of state-varied output pin numbers identifying those state-varied ones of the output pins of the IC of the block number indicated by the first part at which the output logic states represented by the second portion 34 differ from the simulated logic states represented by the simulated signal.

In order to produce the second address signal, the second signal producing unit 37 comprises a comparator 38 for comparing the simulated logic states bit by bit with the output logic states represented by the second portion 34. By way of example, the comparator 38 produces a result signal in which a logic one and a logic zero bit appear when each simulated logic state is different from and the same as, respectively, the output logic state subjected to the bit by bit comparison with the simulated logic state in question. By the use of the fact that the logic one and zero bits are arranged in the result signal in the order of the output pin numbers, a modifying circuit 39 converts the result signal into the second part of the second address signal.

A second memory unit 42 memorizes, for each block number, the block numbers of those connected ones of the IC's 21 through 28 which have input pins directly connected in compliance with the predetermined manner of connection to the output pins of the IC of the block number under consideration and, for the respective output pin numbers of the last-mentioned output pins, the input pin numbers of the last-mentioned input pins. Responsive to the second address signal, the second memory unit 42 produces a second output signal representative of the block number of each IC connected to the IC of the block number indicated by the first part. The second output signal is moreover representative of those state-varied ones of the input pin numbers which are memorized for the respective state-varied output pin numbers indicated by the second part.

A substituting unit 46 is coupled to the first memory unit 32 and is responsive to the simulated signal for substituting the simulated logic states represented by the simulated signal produced in response to the first address signal indicative of a block number, for the output logic states memorized in the first memory unit 32 for the block number in question. The substituting unit 46 is therefore equivalently responsive to the first address signal and the second portion 34 to substitute the simulated logic states for the output logic states represented by the second portion 34, namely, memorized in the first memory unit 32 for the block number indicated by the first address signal.

An updating unit 47 is coupled to the first memory unit 32 and is responsive to the second output signal from the second memory 42 for updating or renewing, with reference to the state-varied input pin numbers represented by the second output signal, the input logic states memorized in the first memory unit 32 for the block number represented also by the second output signal.

Referring to FIG. 3, a logic simulator according to a first preferred embodiment of this invention will be described by assuming that the simulator carries out a diagnosis operation so as to simulate the patient behavior which the logic device exemplified with reference to FIG. 1 will show. The logic simulator comprises a state memory, a simulator, a comparator, and a connection memory, which are of the type described as the first memory unit 32, the simulating unit 36, the comparator 38, and the second memory unit 42 in conjunction with FIG. 2 and will be designated by like reference numerals.

As will later become clear as the description proceeds, a first multiplexer 51 is for supplying a first address signal to the state memory 32. A second multiplexer 52 delivers a second address signal to the connection memory 42.

The first address signal indicates, during indication of the first through the fourth levels, the block numbers 100 through 800 which identify the respective IC's 21 through 28 and are used instead of the actual IC's 21 to 28. In other words, the block numbers simulate the respective IC's. Before indication of the first block number 100, the first address signal indicates zero as the zeroth block or level number.

The second address signal is controlled so as to consecutively indicate the block numbers 100 through 800 and, while indicating each block number, state-varied output pin numbers assigned to those state-varied output pins of the IC identified by the block number being indicated, at each of which a variation takes place in the output logic state as a result of the simulation carried out by the simulator 36 as will later be described more in detail. The state-varied output pin numbers are used in place of the actual state-varied output pins. Before indicating the first block number, the second address signal is also made to indicate zero. Those parts of the second address signal which indicate the block number and the state-varied output pin numbers, will be called first and second parts, respectively.

The state memory 32 comprises a plurality of block memory sectors (not shown) accessible by the first address signal indicative of the respective block numbers 100 through 800. Stated otherwise, the memory sectors are assigned to the respective IC's 21 through 28 according to the respective block numbers. The state memory 32 has an additional memory sector accessible by the first address signal indicative of zero.

The block memory sector allotted to each IC stores state data of the IC under consideration. The block memory sector is for furthermore storing a block flag Fb, which will presently be described.

Each block memory sector comprises a type field, a state field, and a flag field. The state field comprises, in turn, a plurality of bit positions, such as eleventh through thirtieth bit positions of the memory sector as first through twentieth bit positions of the state field. The first through the twentieth bit positions of the state field are assigned to the input and the output pin numbers which identify the input and the output pins of the IC assigned with the memory sector in question.

The state data to be stored in each memory sector comprise the type of the individual logic operation of the IC. A type signal representative of the type is stored in the type field. The state data moreover comprise the input and the output logic states, which are stored in the state field according to the respective pin numbers. For example, let the first and the second input pins have at an instant logic one and zero states, respectively. Logic one and zero bits are stored in the first and the second bit positions of the state field. It will be understood that the state data are for use in more specifically simulating the IC's together with their input and output logic states.

The block flag Fb is for discriminating between the IC's which have each level number in common. As a logic one flag, a logic one bit is stored in the flag field of the memory sector assigned to the IC that is identified by the highest block number among the block numbers of the IC's of the level number under consideration. The flag fields of the memory sectors for the other IC's are loaded with logic zero flags. The logic one block flags therefore serve as level flags.

As will shortly be described, the first address signal indicative of a block number makes the state memory 32 produce the block flag Fb from the memory sector accessed by the block number being indicated. When a level flag is produced, it is understood that the block number or numbers of one level number is all indicated by the first address signal. The first address signal thus equivalently indicates the successive level numbers. Stated otherwise, the first address signal need not actually indicate the respective level numbers but may merely indicate the block numbers from a level number to a higher level number.

The simulator 36 may comprise IC's (not shown) which carry out different individual logic operations, respectively. According to the above-described assumption, the simulator 36 comprises four IC's which correspond in operation to the IC's 21 or 25, 22 or 24, 23 or 27, and 26 or 28, respectively. The simulator 36 may alternatively be a general logic circuit, which may comprise a gate array for simulating the different individual logic operations. As a further alternative, the simulator 36 may comprise an input-output mapping memory. As has briefly been described heretobefore, the simulator 36 provides simulated logic states which correspond to new output logic states obtained by the individual logic operation of each of the IC's 21 through 28.

As will later be described more in detail, the comparator 38 compares the simulated logic states with previous output logic states preliminarily read out of the state memory 32. The previous output logic states are supplied to the comparator 38 through a state latch circuit 53. The simulated logic states are delivered to the comparator 38 through a simulator latch circuit 54.

The connection memory 42 comprises a plurality of block memory segments (not shown) accessible by the second address signal indicative of the respective block numbers 100 through 800. Each memory signal is furthermore accessed by the second address signal indicative of the state-varied output pin numbers. An additional memory segment is accessible by the second address signal indicative of zero and likewise state-varied input terminal numbers.

Each block memory segment stores the block number to be indicated by the second address signal and the output pin numbers of the IC of the stored block number. It will be presumed for the time being that the output pins of the IC of the stored block number are directly connected in conformity with the predetermined manner of connection to a plurality of input pins of each of two IC's of one or more higher level numbers, which comprise the next higher level number and may or may not include a still higher level number. Such IC's are called connected IC's. The input pins will be named connected input pins. A two-bit connection flag Fc indicates such a double connection by logic 10 (one and zero) bits.

Each block memory segment moreover stores the logic 10 connection flag, one of the block numbers assigned to the connected IC's and the input pin numbers of the connected input pins of that one connected IC. The connected input pin numbers are stored in correspondence to the output pin numbers of those connected output pins which are directly connected to the connected input pins of the two connected IC's The block memory segment further stores the block number of the other connected IC and similarly the connected input pin numbers of the other connected IC.

Under the circumstances, each access by the second address signal makes the connection memory 42 produce data (the block and the output and the input pin numbers with or without the logic 10 connection flag) in two steps as first and second data. The first data comprise the indicated block number, the state-varied output pin numbers, the logic 10 connection flag, the block number of one of the connected IC's, and those of the connected input pin numbers which correspond to the respective state-varied output pin numbers. The second data comprise the indicated block number, the state-varied output pin numbers, the block number of the other connected IC, and those of the connected input pin numbers which again correspond to the respective state-varied output pin numbers.

When the output pins of the IC of the stored block number are directly connected to some or all of the input pins of only one IC of the next or more higher level number, the connection flag Fc indicates such a single connection by logic 01 (zero and one) bits. In this event, the second data do not comprise the block and the input pin numbers but instead a connection flag Fc of logic 11 bits (two logic one bits). The logic 11 connection flag serves as a next address pointer as will later be described.

For example, the block memory segment accessible by the block number 500, is loaded with the block number 500, all output pin numbers 551 and 552, the logic 10 connection flag, the block number 600, the input pin numbers 603 and 604, the block number 700, and the input pin numbers 701 and 702. The block memory segment accessible by the block number 600 is loaded with the block member 600, the output pin numbers 651 and 652, the logic 01 connection flag, the block number 800, the input pin numbers 801 and 802, and the logic 11 connection flag.

It is possible to make the first data to not include either the logic 10 or the logic 01 connection flag but the second data to include either the logic 10 or the logic 01 connection flag. The second data may not include the indicated block number and the state-varied output pin numbers even for the double connection.

The additional memory segment likewise stores the block numbers assigned to the connected IC's of the first level and connected input pin numbers of those of the input pins of the connected IC's which are directly connected to the some or all of the first through the fourth input terminals 11 to 14. When at least one of the input terminals 11 through 14 is directly connected to the input pin or pins of an IC of a higher level number, the additional memory segment is loaded also with data for such input pin or pins.

At the start of the diagnosis operation, the state memory 32 simulates the logic states which are carried on the input and the output terminals 11 through 14, 16, and 17 and the input and the output pins of the IC's 21 through 28 before the start of the patient behavior, namely, while the logic device is left in a rest state. On checking the patient behavior, one of the logic states may be changed to a new logic state. In contrast to the new logic state, the logic state before the change is herein called a previous logic state. The logic state is changed from the previous logic state to a new one in the manner which will later be described. The simulation carried out with a new logic state given to one of the input terminals 11 through 14, will be called a cycle of the diagnosis operation.

An address counter 55 has a full count which is equal to the number of IC's 21 through 28. Before the start of each cycle of the diagnosis operation, the address counter 55 is given a count of zero. Later, the count is incremented successively to the full count as will shortly be described. The count eventually returns to zero in preparation for a next subsequent cycle of the diagnosis operation. The address counter 55 thus produces a count signal which cyclically represent the count.

Each cycle of the diagnosis operation begins when the count signal represents the zero count. The operation meanwhile carried out will be called a "level zero" operation.

The count signal is delivered on the one hand to the first multiplexer 51, which selects the count signal as the first address signal. The count signal is fed on the other hand to the second multiplexer 52 (FIG. 3(b)) through various circuit elements which will later be described. The second multiplexer 52 selects the count signal as that first part of the second address signal which indicates the block number indicated by the first address signal. During the level zero operation, the first and the second address signals indicate zero and access the additional memory sector and segment.

The state memory 32 produces a first output signal. The first output signal is delivered on the one hand to a first reversal or inverting circuit 56. In the logic simulator being illustrated, the first reversal circuit 56 does not make use of the first output signal while the first multiplexer 51 selects the count signal as the first address signal. The operation of the first reversal circuit 56 will be described later.

The first output signal is supplied on the other hand to the state latch circuit 53, which is capable of immediately producing the first output signal as a "latched" signal 57 and of latching the first output signal to give a predetermined delay thereto and then to produce the first output signal as a delayed signal 58. The latched and the delayed signals 57 and 58 are called the first and the second portions 33 and 34 in connection with FIG. 2. A combination of the state memory 32 and the state latch circuit 53 therefore corresponds to the first memory unit 32.

The latched signal 57 is supplied to the simulator 36, as briefly described before, and to a block or level flag detector 57, which detects whether the block flag Fb is logic one (a level flag) or logic zero. Upon detection of the logic one block flag, the flag detector 57 produces a level simulation end signal for the purpose which will presently be described.

The simulated signal is fed to the comparator 38 through the simulator latch circuit 54. The delayed signal 58 is delivered directly to the comparator 38 substantially concurrently with the simulated signal.

Let it be assumed in general that the diagnosis operation proceeds to a level number k and a block number b. The count signal represents a count b and makes the first address signal indicate the block number b. The first part of the second address signal also indicates the block number b. The first output signal represents the type of the individual logic operation of the b-th IC of the logic device, the input and the output logic states of the pins of the b-th IC, and either the logic zero or one block flag according to the position of the b-th IC among the k-th level IC's. The latched signal 57 represents the type of the individual logic operation, the input logic states, and the block flag Fb. The delayed signal 58 represents the output logic states.

The simulator 36 simulates the individual logic operation and carries out the simulated logic operation on the input logic states. The simulator 36 makes the simulated signal represent the simulated logic states as the new output logic states of the b-th IC.

The comparator 38 compares the new output logic states bit by bit with the output logic states which the delayed signal 58 represents as the previous output logic states. Let it be temporarily assumed that the output pins of the b-th IC are ten in number and that the previous and the new output logic states are logic 0110001010 and logic 1011110100, respectively.

As a result of the bit by bit comparison, the comparator 38 makes a logic one and a logic zero bit indicate in the result signal that a change is present and absent, respectively, between the previous and the new output logic states of an output pin. The comparator 38 therefore makes the result signal show by logic 1101111110 that the change is present in the output logic states of the first, the second, and the fourth through the ninth output pin numbers.

The bit positions at which the logic one bits appear therefore represent state-varied or value-changed output pin numbers, namely, those of the output pin numbers of the IC of the block number indicated by the first address signal, at each of which the output logic state 1 or 0 memorized in the state memory 32 and read out as the first output signal is varied to the simulated logic state 0 or 1. According to the temporary assumption, the result signal represents that the state-varied output pin numbers are the first, the second, and the fourth through the ninth.

Upon completion of the comparison, the comparator 38 supplies a block flag detector 59 with a logic one bit as a comparison end signal. The flag detector 59 delivers the comparison end signal instantaneously to the address counter 55 unless supplied with the level simulation end signal. When supplied to the address counter 55, the comparison end signal counts up the count.

Before being delivered to the second multiplexer 52, the count signal is supplied to a first first-in first-out buffer (FIFO) 61. The result signal is also supplied to the first FIFO 61. As a result, the first FIFO 61 keeps first and second address data. The first address data are representative of the block number b. The second address data are indicative of the state-varied output pin numbers by logic one bits interspersed at pertinent bit positions. The first FIFO 61 produces a first FIFO signal which represents the first and the second address data for the present.

The first FIFO signal is eventually supplied to the second multiplexer 52 through a second FIFO 62 after being modified into a modified signal by an output pin number detector 63. Detecting the occurrences of the logic one and the logic zero bits in the second address data of the first FIFO signal, the output pin number detector 63 converts the second address data to output pin number data in the modified signal.

The pin number data represent the state-varied output pin numbers. As a temporary assumption, the output pin number data represent output pin numbers b51, b52, and b54 through b59. The first address data pass through the output pin number detector 63 as they are. The second FIFO 62 produces a second FIFO signal comprising the first address data and the output pin number data.

As described above, the count signal represents the successively incremented counts insofar as the logic zero block flags are detected by the block flag detector 59. Until appearance of the level simulation end signal, the above-described processes are repeated for other block numbers assigned to the k-th level IC's of the logic device.

When the level simulation end signal is produced on approaching the end of the k-th level operation, the block flag detector 59 after a preselected delay delivers the comparison end signal to the address counter 55. During the preselected delay, renewal or updating is carried out in the state memory 32 for the output logic states which are subjected to the change by the simulated logic operations. Renewal is also carried out for the input logic states of the input pins directly connected to the state-varied output pins. It is also possible to carry out the renewal of the output and the input logic states during progress of the processes for the k-th level. This is because the block numbers of the k-th level are successively dealt with, starting at the least block number and ending at the highest block number.

In the meantime, the first FIFO 61 makes the first FIFO signal alternately represent the first and the second address data, namely, successively from the lowest block number of the k-th level and then the respective logic one and zero bits of the resultant signal produced for the lowest block number, the signals for the intermediate block up to the highest block number of the k-th level and then the respective bits of the resultant signal produced for the highest block number, through the block number b and then the respective bits of the resultant signal produced for the b-th block number. The first FIFO signal is selected by an additional multiplexer 64, temporarily stored in an additional latch circuit 65, and then supplied to the output pin number detector 63 on the one hand and to an additional reversal circuit 66 on the other hand.

Operation of the pin number detector 63 is as follows. Through the additional multiplexer 64 and the latch circuit 65, the first FIFO 61 supplies the pin number detector 63 with the block number and subsequently the resultant signal. It will be assumed that the block number is b and the resultant signal represents 1101111110. Inasmuch as the logic one and zero bits are arranged in the resultant signal in the order of the output pin numbers as described above, the resultant signal shows that the output logic states are varied at the pin numbers 1, 2, and 4 through 9. The pin number detector 63 detects the above-exemplified pin numbers 1, 2, and 4 through 9 and combines the pin number with the block number b and the number "5" for the output pin numbers into the state-varied output pin numbers b51, b52, and b54 through b59.

As described above, the output pin number detector 63 supplies the second FIFO 62 with the modified signal which successively represent from the block number of the lowest numbered IC among the k-th level IC's and then the respective state-varied output pin numbers of the lowest numbered IC, the signals for the intermediate blocks up to the block number of the greatest numbered k-th level IC and then the state-varied output pin numbers of the highest numbered IC, through the block number b and then the state-varied output pin numbers of the b-th IC. Meanwhile, the outpin pin number detector 63 delivers the modified signal also to the additional reversal circuit 66. The additional reversal circuit 66 produces an inverted signal by inverting the logic one bits to logic zero bits only at the bit positions indicated by the state-varied output pin numbers. The inverted signal gives all logic zero bits for the second address data. For example, the additional latch circuit 65 delivers the resultant signal of 1101111110 to the additional reversal circuit 66. At this instant, the pin number detector 63 delivers the pin numbers b51, b52, and b54 through b59 to the additional reversal circuit 66. Controlled by the pin numbers 1, 2, and 4 through 9, the additional reversal circuit 66 inverts all logic one bits of the resultant signal to logic zero bits. In other words, the additional reversal circuit 66 is enabled at those bit positions of the result signal which are indicated by the state-varied output pin numbers. It is readily possible to implement such a reversal circuit by a combination of logic circuits.

The second FIFO 62 therefore makes the second FIFO signal successively represent combinations of the block number and the state-varied output pin numbers. The second multiplexer 52 selects each combination from the second FIFO signal. A combination of the circuit elements 61 through 66 therefore corresponds to the modifying circuit 39 described in conjunction with FIG. 2. As described before, the connection memory 42 produces a second output signal in two steps as a first step signal 67 and a last step signal 68.

Figure 3A:
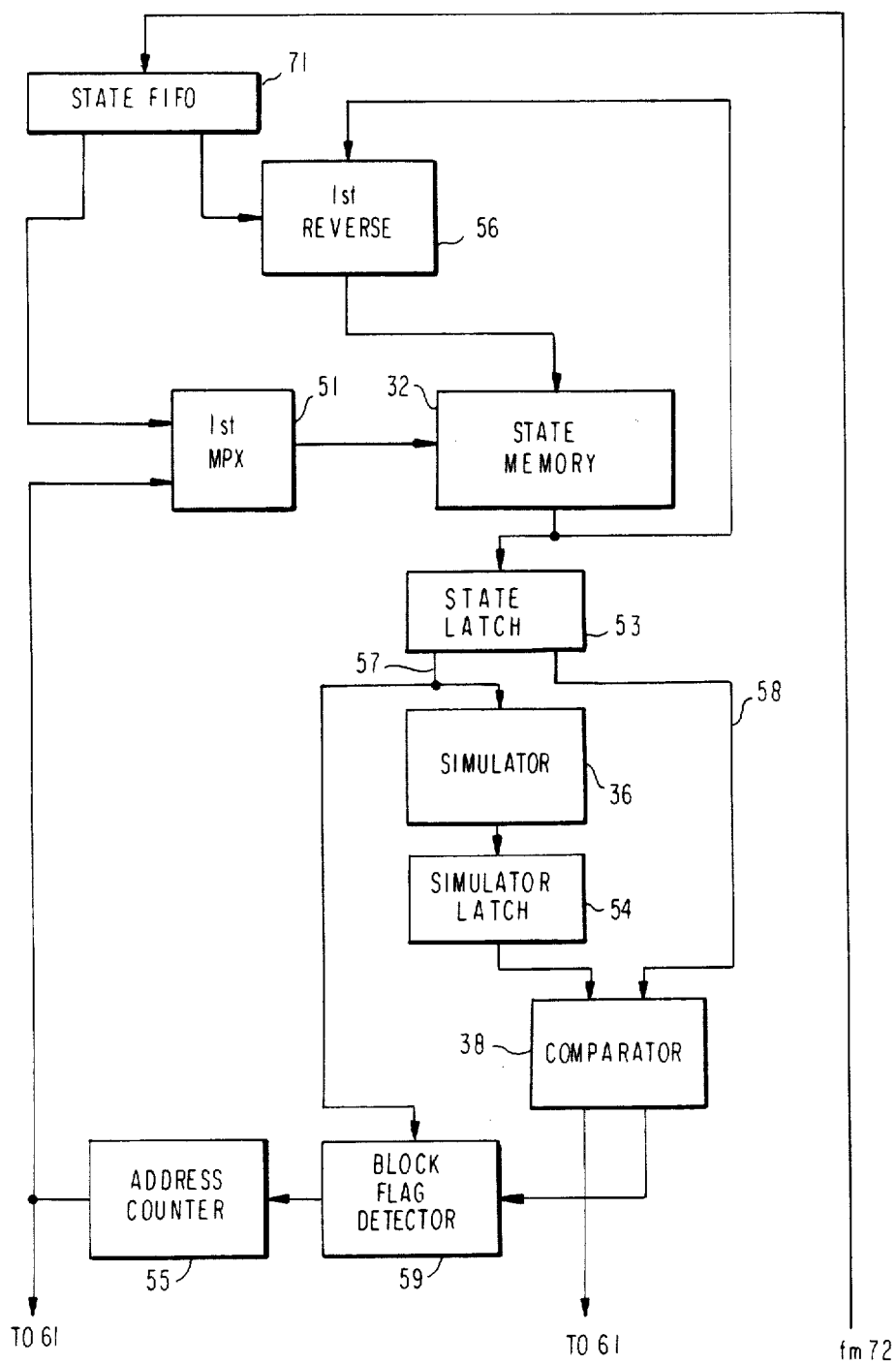
FIGS. 3(a) and (b), when connected to each other in the manner indicated by reference numerals, show a block diagram of a logic simulator according to a first preferred embodiment of this invention.
Figure 3B:
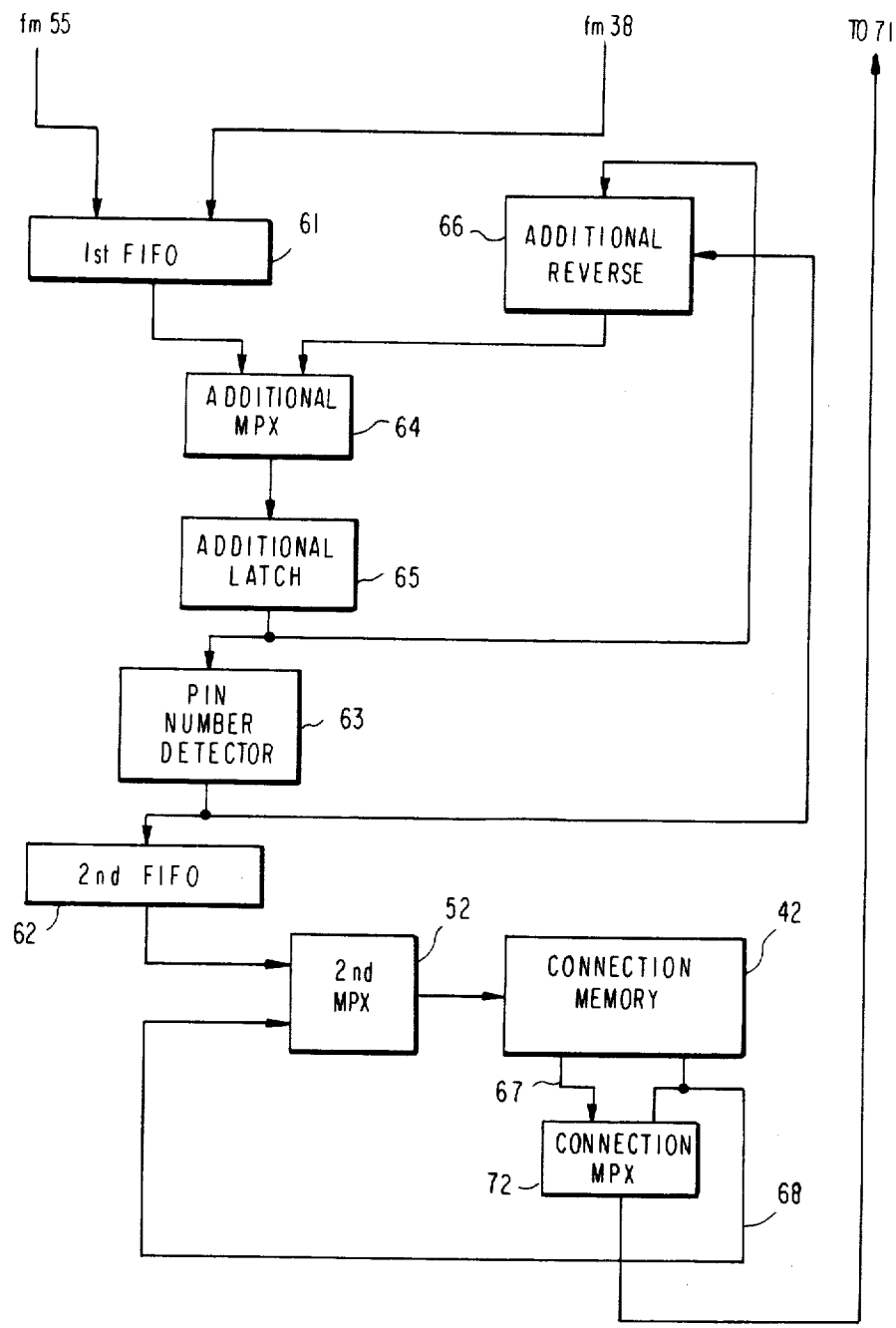

When the connection flag Fc is logic 01, the first step signal 67 is delivered to a state FIFO 71 (FIG. 3(a)) through a connection multiplexer 72 (FIG. 3(b)). The last step signal 68 is supplied also to the connection meltiplexer 72 and to the second multiplexer 52. The logic 11 connection flag comprised by the last step signal 68 inhibits selection of the last step signal 68 by the connection multiplexer 72. Instead, the logic 11 connection flag serves as the next address pointer in making the second multiplexer 52 at once select the next following combination as the second address signal. The connection flag Fc of the logic 10 bits, makes the connection multiplexer 72 select the first step signal 67 at first and eventually the last step signal 68 and also makes the second multiplexer 52 keep selection of the combination until selection by the connection multiplexer 72 of the last step signal.

When the second address signal indicates the b-th block number by the first part and the state-varied output pin numbers for the b-th block number by the second part, the step signal 67 or 68 represents the b-th block number, the state-varied output pin numbers for the b-th block number, one of the block numbers representative of an IC having input pins connected to output pins of the b-th IC, and the state-varied input pin numbers of of the higher level IC as described before.

The state FIFO 71 produces a state FIFO signal, which is delivered on the one hand to the first multiplexer 51. The first multiplexer 51 selects the b-th block number to make the first address signal again indicate the b-th block number. The state memory 32 makes the first output signal represent, among others, the (previous) output logic states of the respective output pin numbers for the b-th block number.

The state FIFO signal is supplied on the other hand to the first reversal circuit 56. As described heretobefore, the first output signal is supplied also to the first reversal circuit 56. Using the state-varied output pin numbers given by the state FIFO signal subsequent to the b-th block number, the first reversal circuit 56 inverts the logic one or zero bit of the previous output logic state at every state-varied output pin number, leaving other logic one and zero bits at the other output pin numbers as they are. The first reversal circuit 56 thus produces new output logic states for the b-th block number. The new output logic states are supplied back to the state memory 32 and stored therein in the memory sector accessed by the first address signal, which still indicates the b-th block number given by the state FIFO signal. Operation of the first reversal circuit 56 is not different from the above-described operation of the additional reversal circuit 66. The first reversal circuit 56 is therefore similar in structure to the additional reversal circuit 66.

The state FIFO signal next gives the above-mentioned one block number and the input pin numbers corresponding to the state-varied output pin numbers. Previous input logic states for that block number are renewed or updated to new input logic states. In this manner, the previous input logic states of the higher level number or numbers are rendered equal to the new output logic states for the b-th block number.

Although so called, the first address signal is not now used in reading the first output signal from the state memory 32 for the simulated logic operation. The address counter 55 should therefore be understood as the first signal producing unit 31 described in conjunction with FIG. 2.

It is now understood that such a renewal operation is possible even when the output pins of a particular IC are connected to input pins of three or more IC's of the higher level number or numbers. The connection flag Fc may represent two logic zeros in order to indicate that the output pins of an IC indicated by the first part of the second address signal are connected to no input pins of another IC as is the case with the eighth IC 28. It is also possible, by manually or otherwise giving an input pin number of a block number and a new input logic state for the input pin number, to make the logic simulator simulate a particular patient behavior. This is also possible on giving a new logic state to one of the input terminals 11 through 14. If it is desired to give a new output logic state to an output pin number of a block number, the data should be entered in the second FIFO 62.

It is believed that the level zero operation is clear from the above. It is possible to make the level zero operation step into the level one operation either by manually setting a count of one in the address counter 55 or by automatically counting up the count by the comparison end or the level simulation end signal.

When the diagnosis operation is carried out up to the highest level number, the new output logic states are used in rewriting the previous output logic states of the output terminals 16 and 17 in the additional memory sector of the state memory 32. The block number zero for the additional memory sector is indicated by the state FIFO signal. In response to the logic one block flag produced as a level flag on carrying out the simulated logic operation for the last-numbered IC of the highest level, the count is renewed or reset in the address counter 55 to zero. The logic simulator is ready for another cycle of the diagnosis operation.

It is possible to understand the above-described renewal operation by separating substitution of the simulated logic states for the previous output logic states in the state memory 32 from updating of the input logic states of the connected IC or IC's by the substituted output logic states. The substitution is carried out, in the manner similar to the updating operation, by an additional output signal representative of the block number and the state-varied output pin numbers indicated by the first and the second parts of the second address signal, respectively. In the example illustrated with reference to FIG. 2, the substituting unit 46 is carries out the separated substitution operation and the updating unit 47 carries out the remaining updating operation.

It is possible to classify the operation for each level into first through fourth stages. In the first stage, the result signal is obtained by reading the input logic states from the state memory 32 successively for the block numbers of that level. In the second stage, the state-varied output pin numbers are obtained from the result signal. In the third stage, the input pin numbers and the like are read from the connection memory 42. In the fourth stage, the state memory 32 is rewritten or updated into the new output and input logic states. These four stages are carried out substantially in parallel as follows.

More particularly, it will be assumed that the k-th level comprises IC's of four block numbers b, (b−1), (b−2), and (b−3) in descending order. When the first stage is carried out for the b-th block number, the second through the fourth stages are carried out for the (b−1)-th block number, the (b−2)-th block number, and the (b−3)-th block number, respectively. The four stages are carried out in a pipeline fashion by using the state memory 32, the first FIFO 61, the second FIFO 62, and the state FIFO 71 as buffers between the stages. The pipeline operation reduces the time for the diagnosis operation to about one-fourth as compared with a serial operation. Furthermore, the level flag is used to make the pipeline operation proceed from one level to a next higher level after definitely deciding the input logic states of the next higher level or still more higher levels. This insures the diagnosis operation against erroneous simulation which might otherwise result from uncertainity of the input logic states to be subjected to simulation.

An IC has thus far been used as a representative of each logic block of the logic device. Each logic block may, however, be a plurality of IC's. On the other hand, a custom LSI may be divided into a plurality of logic blocks.

With FIG. 1 in mind, a logic device will temporarily be assumed to be of the type which is similar to the illustrated one except that the second and the fourth levels consist of only one logic block and of two logic blocks, respectively, and that the third logic block 23 has block output terminals conected only to block input terminals of a third level logic block and of a fourth level logic block. The third logic block 23 need not necessarily be given the level number one.

Stated more in general, the level number of each logic block is more preferably decided in such a temporarily assumed logic device with attention directed to the logic blocks having block input terminals connected to the block output terminals of the logic block under consideration. The level number should be equal to or greater than the maximum of the numbers of types of individual logic operations by which the output logic states are determined for the block output terminals of the logic block under consideration. The level number should furthermore be equal to or less than the minimum of the maxima of the numbers of individual logic operations by which the input logic states are decided for all block input terminals of the logic blocks to which attention is directed.

In the temporarily assumed logic device, the maximum of the numbers of individual logic operations by which the output logic states of the third logic block 23, is one. When the third level IC's 26 and 27 are taken into consideration, the maximum of the number of individual logic operations by which the input logic states are decided, is two. When attention is directed to the fourth level IC 28, the maximum is three. The minimum of the maxima is two. The third logic block 23 may therefore be of any one of the level numbers one and two. When the third logic block 23 is given the level number two, each level consists of two logic blocks.

It is thus possible to distribute the logic blocks to the levels as uniformly as possible as regards the number of logic blocks in each level. This makes it possible to simulate the output logic states of each level in a shortest possible time after determination of all input logic states of that level.

Figure 4:
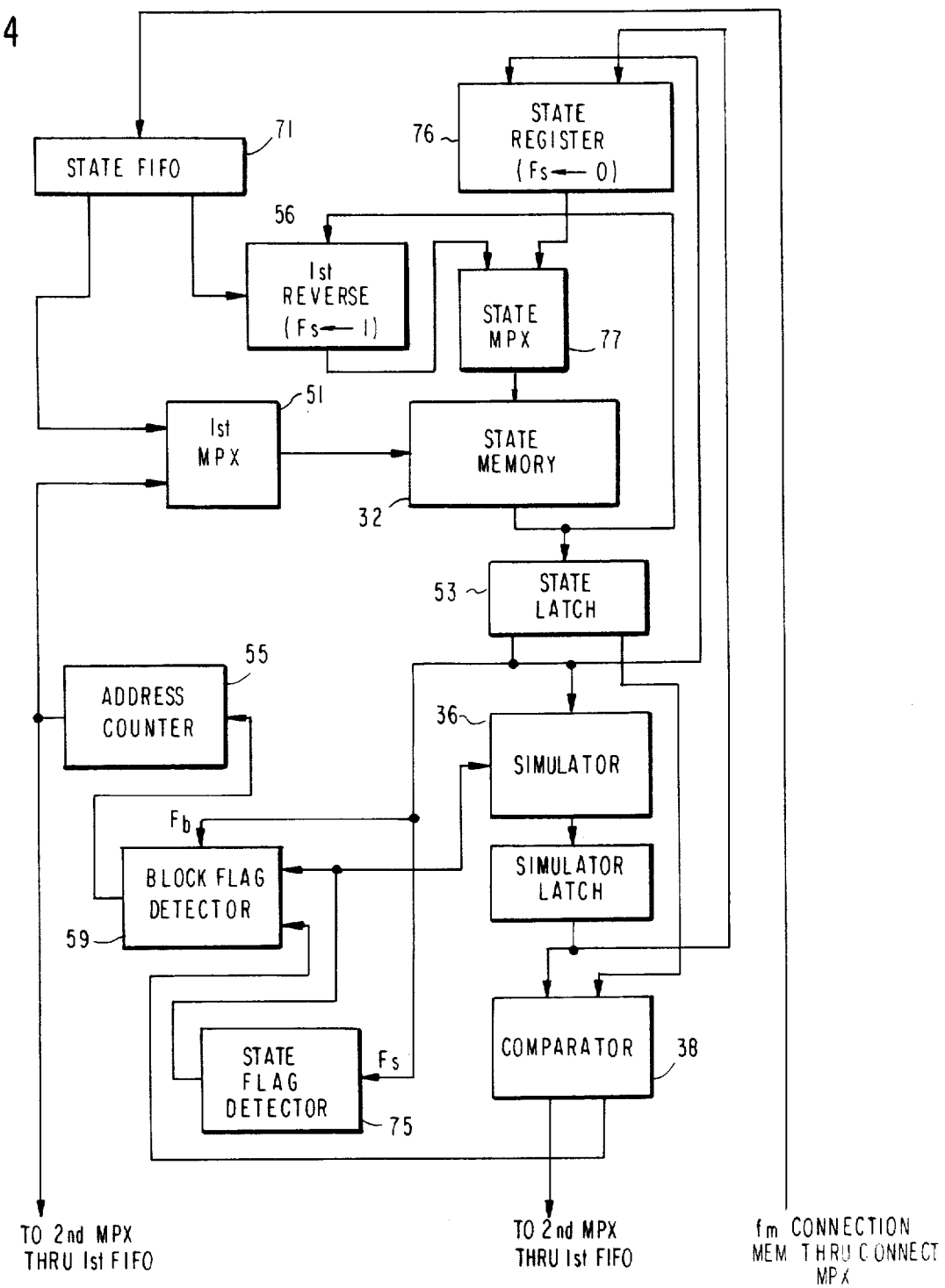
FIG. 4 is a fragmentary block diagram of a logic simulator according to a second preferred embodiment of this invention.

Referring to FIG. 4, a logic simulator according to a second preferred embodiment of this invention comprises similar parts designated by like reference numerals. The logic simulator being illustrated, is operable by similar signals.

Each memory sector of the state memory 32 comprises an additional flag field for a state flag Fs of one bit. The state flag Fs is given a prior state, such as the logic one state, before the output logic states are renewed in response to a change in the input logic state or states. After the output logic states are renewed, the state flag Fs is given a later state as, for example, the logic zero state.

A logic signal representative of the state flag Fs is included in the first output signal and delivered towards the state latch circuit 53 and to the first reversal circuit 56. The logic signal is included also in the "latched" signal 57 and supplied to a state flag detector 75 and to a state register 76 while the latched signal 57 is fed to the simulator 36. The state register 76 produces a register signal, which will presently be described more in detail. The signal produced by the first reversal circuit 56 is herein called an inverted signal. A state multiplexer 77 supplies the state memory 32 with a selected one of the register and the inverted signals.

At the outset of the diagnosis operation, the initial states of the logic device are successively placed in the state register 76 together with the prior-state state flags and are moved to the state memory 32 through the state multiplexer 77. With the first address signal made to consecutively indicate the block numbers, the initial states are stored in the block and the additional memory sectors, respectively, together with the prior-state state flags.

The state flag detector 75 detects whether the state flag Fs has the prior or the later state. Whenever the posterior state is detected, a detection signal produced by the state flag detector 75 is given a logic one bit. So long as the prior states are detected, the detection signal is kept at the logic zero state.

The detection signal is delivered to the block flag detector 59. When kept in the logic zero state, the detection signal has no effect on the block flag detector 59. The detection signal of the logic one bit serves as another comparison end signal for the purpose which will later be described. The detection signal is supplied also to the simulator 36 to suspend the simulation while the detection signal is kept at the logic one state. Only when the detection signal is given the logic zero bit, the simulator 36 carries out the simulation as described before.

During the diagnosis operation for the b-th block number of the k-th level, the input logic states are stored in the state register 76 while supplied to the simulator 36. Inasmuch as the detection signal is given the logic zero bit, the simulator 36 carries out the simulation on the input logic states. The simulated signal is supplied not only to the comparator 38 but also to the state register 76. The simulated logic states are combined in the state register 76 with the input logic states already stored therein. Through the state multiplexer 77, the state register 76 supplies the combined logic states to the state memory 32 with the state flag Fs given the posterior state. The combined logic states and the later-state state flag are stored in the memory sector being accessed by the first address signal which is given by the count signal and is used in reading the input logic states and the like out of the accessed memory sector.

Inasmuch as the output logic states are thus renewed, each memory segment of the connection memory 42 (FIG. 3(b)) need not comprise a field for the block number to be indicated by the first part of the second address signal and the output pin numbers for the block number indicated by the first part. The memory segment therefore stores, for a single connection, the block number assigned to that connected IC of the logic device which has input pins connected to the output pins of the IC of the block number indicated by the first part, those connected input pin numbers among the input pin numbers of the connected IC which are given to the input pins connected to the output pins, and the connection flag Fc. For a double or a higher multiple connection, the memory segment stores similar block numbers and like connected input pin numbers.

Each of the first and the last step signals 67 and 68 represents the block number of each connected IC and the input pin numbers of those state-varied ones of the connected input pin numbers which correspond to the state-varied output pin numbers indicated by the second part of the second address signal and may represent the connection flag Fc. Such a step signal 67 or 68 is delivered to the state FIFO 71 (FIG. 3(a)) through the connection multiplexer 72 (FIG. 3(b)).

The state flag Fs stored in the state memory 32 and supplied to the first reversal circuit 56 for the block number indicated by the step signal 67 or 68 through the state FIFO 71 and the first multiplexer 51, is in the later state because the output logic states are stored therein by the state register 76. As the case may be, the output logic states are previously rewritten into the simulated logic states during a previous cycle of the diagnosis operation. Also in this event, the state flag Fs represents the later state.

In addition to the operation described in conjunction with FIG. 3, the first reversal circuit 56 inverts the state flag Fs from the later state to the prior state. This shows that the output logic states are not yet renewed during the instant cycle of the diagnosis operation and are subject to the renewal by the simulated logic states.

The logic simulator carries out, during the operation for each level, the diagnosis operation in first through fourth stages as is the case with the logic simulator illustrated with reference to FIG. 3. Renewal of the output logic states of an IC of a certain block number is, however, carried out in the first stage during indication by the first address signal of the block number under consideration rather than in the fourth stage.

Use of the state flag Fs is applicable also to the logic simulator illustrated with reference to FIG. 3. The state flag Fs gives a faster rate of operation. As described hereinabove, it may be desirous during the diagnosis operation to change an input logic state of a specific one of the IC's 21 through 28 (FIG. 1) so as to partially carry out a cycle. It may be that the specific IC is followed in the same level by other IC's. Under the circumstances, the later-state state flags are stored in the state memory 32 for the block numbers assigent to the other IC's. The later-state state flags make the state flag detector 75 repeatedly produce the logic one detection signal. This makes the diagnosis operation proceed for the level in question without actually carrying out the four stages for the other block numbers. This applies to some of the higher level IC's.

Figure 5:
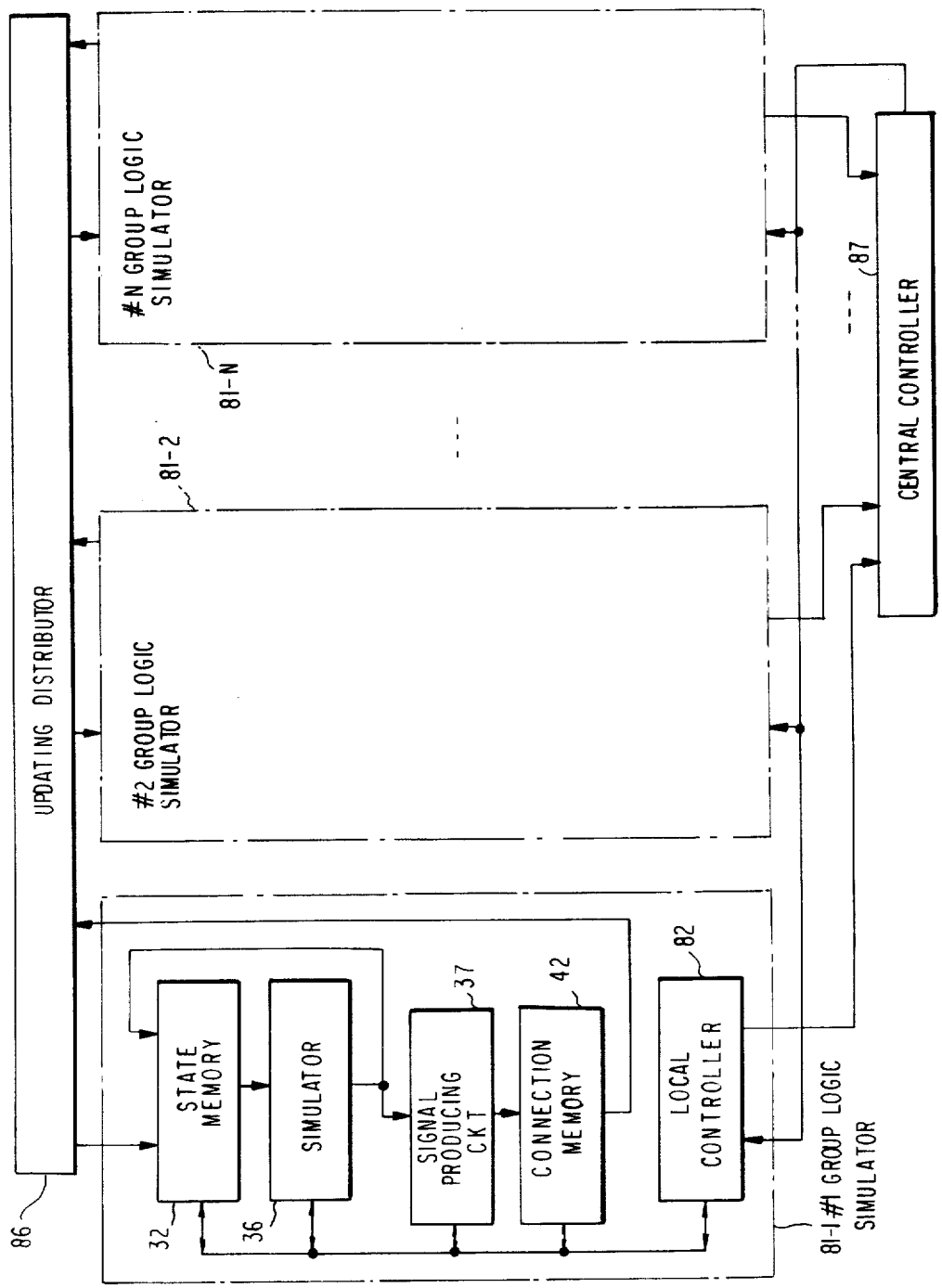
FIG. 5 is a block diagram of a logic simulator according to a third preferred embodiment of this invention.

Referring finally to FIG. 5, a logic simulator according to a third preferred embodiment of this invention comprises first through N-th group logic simulators 81-1, 81-2, ..., 81-n, ..., and 81-N, where each of n and N represents an integer. The entire logic simulator may be called a logic simulation system.

The logic simulation system is used to carry out a diagnosis operation on an overall logic operation of a logic device in which the IC's of each level are allotted to a third predetermined number of groups. It is preferred that the third predetermined number be not less than the maximum number of IC's on each level. The above-described integer N is equal to the third predetermined number. The IC's or the block numbers are therefore allotted to a first through an N-th group. For example, the block numbers 100, 400, and 600 of the first, fourth, and sixth IC's 21, 24, and 26 (FIG. 1) are allotted to the first group. The block numbers 200, 500, and 700 are allotted to the second group. The first through the N-th group logic simulators 81-1 to 81-N are assigned to the first through the N-th groups, respectively. In forming groups of IC's, it is desirable that the groups have approximately equal numbers of IC's.

As depicted in the first group logic simulator 81-1, each group logic simulator 81 (the suffix being omitted) is similar in structure to the logic simulator illustrated with reference to FIG. 4. The group logic simulator 81 comprises a state memory 32, a simulator 36, a (second) signal producing circuit 37, and a connection memory 42. The state register 76 (FIG. 4), when used as a substituting unit 46 (FIG. 2), is depicted by a mere connection extended from the simulator 36 to the state memory 32. The first address signal is produced by a local controller 82, which is shown to exchange data with the state memory 32 (for example, the logic one block flag used as the level flag), the simulator 36 (the state flag Fs), the signal producing circuit 37 (the first address signal used as the first part of the second address signal), and the connection memory 42.

The logic simulation system comprises an updating distributor 86 in place of the first reversal circuit 56 (FIG. 4) which the group logic simulators 81 should comprise as the principal components of the respective updating units 47 (FIG. 2). The updating distributor 86 serves also as the state register 76 in initializing the state memories 32 in the respective group logic simulators 81.

The first or the like step signal 67 or 68 (FIG. 3 (b)) produced by the connection memories 42 of the respective group logic simulators 81 are supplied to the updating distributor 86. When produced by the second group logic simulator 81-2 for the block number 500 (the fifth IC 25), the step signals 67 and 68 represent the block numbers 600 and 700 (the sixth and seventh IC's 26 and 27). Inasmuch as the block numbers 600 and 700 are assigned to the first and the second group logic simulators 81-1 and 81-2, the step signals 67 and 68 produced by the second group logic simulator 81-2 are distributed to the first and the second group logic simulators 81-1 and 81-2, respectively. The new input logic states are stored in the state memories 32 of these group logic simulators 81-1 and 81-2.

In this manner, simulation of the individual logic operations of the IC's of each level is substantially concurrently carried out by the group logic simulators 81-1, 81-2, and so on. Upon completion of simulation of the individual logic operations for each level, the logic one block flag (the level flag) is detected by the local controller 82 of a certain one of the group logic simulators 81. The local controller 82 delivers the level simulation end signal to a central controller 87. After a prescribed delay for updating the state memories 32, the central controller 87 makes the local controllers 82 of the respective group logic simulators 81 substantially concurrently produce the first address signals indicative of different block numbers of the next higher level.

It is possible to implement the updating distributor 86 by a cross-bar exchange. The central controller 87 may be a combination of AND gates and a delay circuit. It is possible to understand that the function of the local controllers 82 for detection of the level flag is carried out by the updating distbibutor 86.

While a few embodiments of this invention have so far been described, it will now readily be possible for one skilled in the art to carry this invention into effect in various other manners. In particular, it is possible to substitute the simulated logic states for the previous output logic states and to update the input logic states by the new output logic states in various other ways. For example, those of the block output terminals of the logic block which are directly connected to block input terminals of the logic block or blocks of higher levels, may be referred to on updating the input logic states instead of only the state-varied output terminals. Each group logic simulator 81 described in conjunction with FIG. 5 may be a logic simulator of the type illustrated with reference to FIG. 3.

What is claimed is:

1. A logic simulator for simulating an overall logic operation carried out by a logic device on a device input signal to provide a device output signal, said logic device being divisible into a plurality of logic blocks, each said logic block being identified by a unique block number and carrying out individual logic operations, said individual logic operations being identified by logic operation types, each said logic block having block input and output terminals identified by block input and output terminal numbers, respectively, and directly connected to one another in a predetermined manner of connection so that said device input signal may flow through said logic device to provide input and output logic states at said block input and output terminals with said individual logic operations carried out on said input logic states to provide said output logic states and eventually said device output signal, said logic blocks being given level numbers according to the flow of said device input signal from a lower numbered level to a higher numbered level, said logic simulator comprising:

first signal producing means for producing a first address signal successively indicative of the block numbers of the respective logic blocks of each level number and then the block numbers for a next higher level number;

first memory means for memorizing, for the respective block numbers, the logic operation types and, for each block number, the input and the output logic states of the logic block of the block number under consideration, said first memory means being responsive to the first address signal indicative of each block number to produce a first output signal representative of the logic operation type for the block number being indicated and the input and output logic states for the indicated block number;

simulating means responsive to the first output signal produced in response to the first address signal indicative of each block number for simulating the individual logic operation of the logic operation type represented by the first output signal to provide a simulated logic operation for the indicated block number, said simulating means thereby carrying out said simulated logic operation on the input logic states represented by said first output signal to provide simulated logic states for the indicated block number and to produce a simulated signal representative of said simulated logic states;

second signal producing means responsive to said first address and output signals and said simulated signal for producing a second address signal comprising a first and a second part, said first part being indicative of each block number indicated by said first address signal, said second part being indicative of state-varied output terminal numbers identifying those state-varied ones of the block output terminals of the logic block of the block number indicated by said first part at which the output logic states represented by said first output signal are different from the simulated logic states represented by said simulated signal, said second signal producing means comprising a first FIFO means for receiving and storing said first address signals and a PIN number detector means connected to receive said first address data and to detect those output terminals having a changed state by sequentially outputting the numbers of those terminals having output varied states, said PIN number detector combining the address data representing a particular block with address data representing its state varied terminals to produce said second address signal;

second memory means for memorizing, for each block number, the block number of those connected ones of said logic blocks which have block input terminals directly connected in said predetermined manner of connection to the block output terminals of the logic block of the block number under consideration and, for the respective block output terminal numbers of the last-mentioned block output terminals, the block input terminal numbers of the last-mentioned block input terminals, said second memory means being responsive to said second address signal to produce a second output signal representative of the block number of each connected logic block for the block number indicated by said first part and those state-varied ones of the block input terminal numbers which are memorized for the respective state-varied output terminal numbers indicated by said second part;

substituting means coupled to said first memory means and responsive to said simulated signal for substituting the simulated logic states represented by the simulated signal produced for the block number indicated by said first address signal for the output logic states memorized in said first memory means for the block number indicated by said first address signal; and updating means coupled to said first memory means and responsive to said second output signal for updating, with reference to the state-varied input terminal numbers represented by said second output signal, the input logic states memorized in said first memory means for the block number represented by said second output signal.

2. The logic simulator of claim 1 wherein said FIFO means further comprises a FIFO circuit for storing in sequence each block number generated by said first signal producing means, a multiplexer circuit for selecting one block number at a time from said FIFO circuit and a latch circuit for storing the selected block number, said stored block numbers being supplied in sequence as an input to said PIN number detectors, and reversal circuit means responsive to the block number of said latch circuit and the state varied terminal numbers from said PIN number detector for providing an inverted binary signal to said multiplexer circuit.

3. A logic simulator as claimed in claim 1, wherein the level number is given to each logic block with attention directed to the logic blocks having block input terminals directly connected to the block output terminals of the logic block under consideration so as to be not less than a maximum of those numbers of individual logic operations by which the output logic states are decided for the block output terminals of the logic block under consideration and so as to be not greater than a minimum of maxima of those numbers of individual logic operations by which the input logic states are decided for all block input terminals of the logic blocks to which attention is directed.

4. A logic simulator as claimed in claim 3, wherein said substituting means comprises:

additional means responsive to said second address signal for producing an additional output signal representative of the block number indicated by said first part and the state-varied output terminal numbers indicated by said second part; and renewing means coupled to said first memory means and responsive to said additional output signal for renewing, with reference to the state-varied output terminal numbers represented by said additional output signal, the output logic states memorized in said first memory means for the block number represented by said additional output signal.

5. A logic simulator as claimed in claim 2, wherein said first signal producing means makes said first address signal keep indication of each block number until said substituting means substitutes the simulated logic states for the output logic states for the block number being indicated.

6. A logic simulator as claimed in claim 3, wherein said logic simulator comprises a plurality of first signal producing means, of simulating means, of first memory means, of second signal producing means, of second memory means, and of substituting means;

wherein the logic blocks of each level number are allotted to a different one of a predetermined number of groups, each logic block having an associated block member;

wherein each of said first signal producing means, said first memory means, said simulating means, said second signal producing means, said second memory means, and said substituting means is assigned to the respective groups so that the means assigned to a same group deal with the block number of the logic block of the group under consideration;

said updating means comprising:

first means coupled to the first memory means assigned to the respective groups and responsive to the second output signal produced by the second memory means assigned to each group for updating the input logic states in the first memory means assigned to the group comprising the logic block of the block number represented by the last-mentioned second output signal; and second means coupled to said first means and to the first signal producing means assigned to the respective groups for the making said first address signal substantially concurrently indicate the block numbers of each level number with the level numbers successively changed to a next higher level number when the input logic states are updated in the first memory means assigned to the respective groups.

* * * * *